US007683619B2

(12) United States Patent
Smith et al.

(10) Patent No.: US 7,683,619 B2
(45) Date of Patent: Mar. 23, 2010

(54) HIGH IMPEDANCE DIFFERENTIAL INPUT PREAMPLIFIER AND ANTENNA FOR MRI

(75) Inventors: Jolinda C. Smith, Eugene, OR (US); Clifford D. Dax, Creswell, OR (US); Ray L. Nunnally, Parker, CO (US)

(73) Assignee: The State of Oregen Acting by and through the State Board of Higher Education on Behalf of the University of Oregon, Eugene, OR (US)

( * ) Notice: Subject to any disclaimer, the term of this patent is extended or adjusted under 35 U.S.C. 154(b) by 0 days.

(21) Appl. No.: 12/066,244

(22) PCT Filed: Sep. 11, 2006

(86) PCT No.: PCT/US2006/035578

§ 371 (c)(1),
(2), (4) Date: Mar. 7, 2008

(87) PCT Pub. No.: WO2007/030832

PCT Pub. Date: Mar. 15, 2007

(65) Prior Publication Data

US 2008/0258731 A1 Oct. 23, 2008

Related U.S. Application Data

(60) Provisional application No. 60/715,838, filed on Sep. 9, 2005.

(51) Int. Cl.
*G01V 3/00* (2006.01)
(52) U.S. Cl. .................... 324/309; 324/307
(58) Field of Classification Search ......... 324/300–322; 600/407–435
See application file for complete search history.

(56) References Cited

U.S. PATENT DOCUMENTS

| 4,638,253 | A | | 1/1987 | Jaskolski et al. |
| 4,839,596 | A | * | 6/1989 | Sugiura ..................... 324/322 |
| 5,349,298 | A | * | 9/1994 | Nakabayashi ............... 324/322 |
| 5,646,530 | A | | 7/1997 | Strenk et al. |
| 6,326,867 | B1 | * | 12/2001 | Lee et al. ..................... 333/206 |
| 6,998,842 | B2 | * | 2/2006 | Sinnema et al. ............. 324/318 |

(Continued)

OTHER PUBLICATIONS

Cizek et al: System for Automatic Measurement of Nuclear Magnetic Resonance and Spin-Lattis Relaxation of Oriented Radiioactive Nuclei; Pribory I Tekahnika Eksperimenta: vol. 29, No. 5, pp. 53-56 (1986). Translation Journal: Instruments and Experimental Techniques: vol. 29, No. 5, pp. 1040-1044 (1986).*

(Continued)

*Primary Examiner*—Brij B Shrivastav
(74) *Attorney, Agent, or Firm*—Lumen Patent Firm

(57) ABSTRACT

Antenna assemblies for magnetic resonance signals comprise a non-resonant loop antenna and a high impedance differential amplifier. The amplifier can include first and second high electron mobility transistors that have gates coupled to an antenna loop that is defined on a rigid substrate. The non-resonant loop has an effective length of less than about 1/10 of a wavelength of a signal to be detected. Arrays of such loops can be defined on the rigid substrate, and HEMTs for the loops secured to the substrate.

5 Claims, 4 Drawing Sheets

U.S. PATENT DOCUMENTS 7,560,931 B2 * 7/2009 Nabetani ............... 324/322
2006/0137891 A1 * 6/2006 Berens et al. ............ 174/36
2009/0231211 A1 * 9/2009 Zweers ................. 343/702

OTHER PUBLICATIONS

X. Zhang, et al, Non-Resonant Microstrip (NORM) RF Coils: An Unconventional RF Solution to MR Imaging and Spectroscopy, Proceedings of the ISMRM 16th Annual Meeting, Toronto, Canada, 2008, p. 435.

X. Zhang, et al, Studies on MR Reception Efficiency and SNR of Non-resonance RF Method (NORM), Proceedings of the ISMRM 17th Annual Meeting, Honolulu, Hawaii, 2009, p. 104.

M. S. Ramirez, and J. A. Bankson, Resonance Shift Decoupling: A Potential Alternative to Low Input Impedance Preamplifiers, Proceedings of the ISMRM 17th Annual Meeting, Honolulu, Hawaii, 2009, p. 103.

De Zanche, N., Massner, J. A., Leussler, C., & Pruessmann, K. P. (2008). Modular design of receiver coil arrays, Nmr in Biomedicine, 21(6), 644-654.

Nordmeyer-Massner, J. A., De Zanche, N., & Pruessmann, K. P. (2009). Mechanically Adjustable Coil Array for Wrist MRI, Magnetic Resonance in Medicine, 61(2), 429-438.

B. Wu et al, Multi-purpose Flexible Transceiver Array at 7T, Proceedings of the ISMRM 17th Annual Meeting, Honolulu, Hawaii, 2009, p. 107.

* cited by examiner

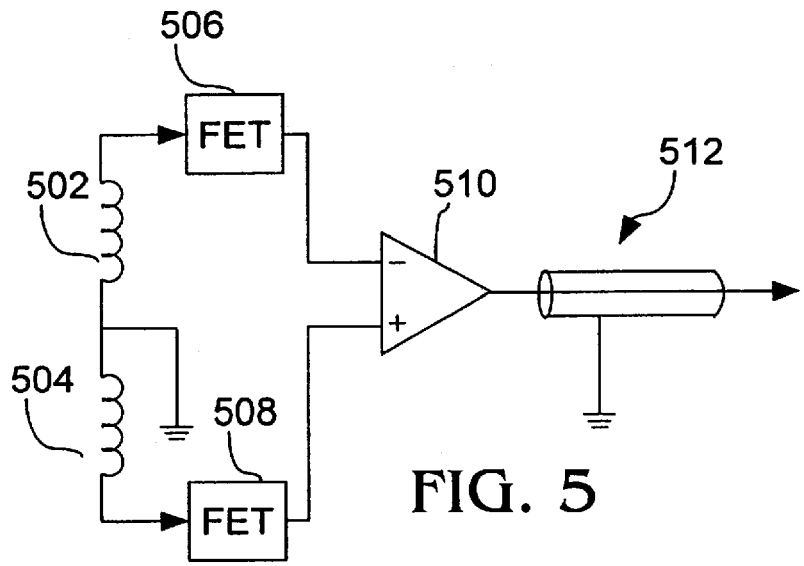
FIG. 5
FIG. 6
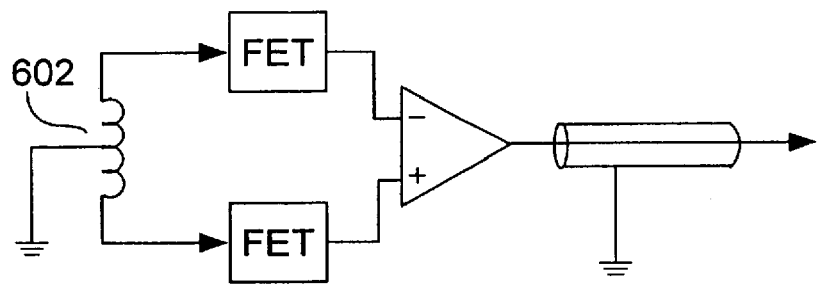
FIG. 7
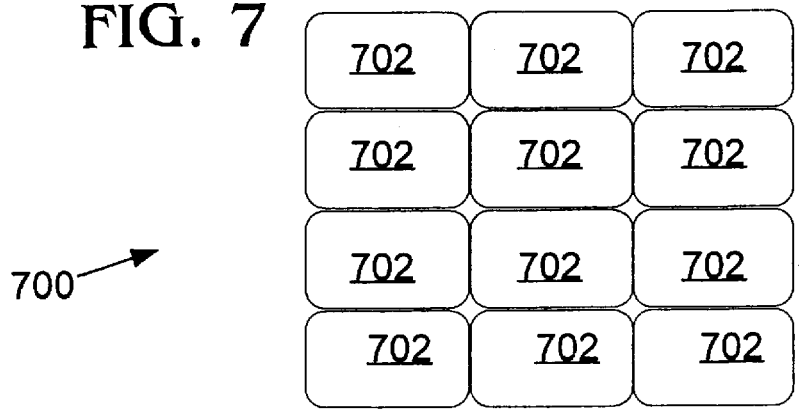

HIGH IMPEDANCE DIFFERENTIAL INPUT PREAMPLIFIER AND ANTENNA FOR MRI

CROSS-REFERENCE TO RELATED APPLICATIONS

This application is the National Stage of International Application No. PCT/US2006/035578, filed Sep. 11, 2006, which claims the benefit of U.S. Provisional Application 60/715,838, filed Sep. 9, 2005, that is incorporated herein by reference.

TECHNICAL FIELD

The disclosure pertains to coils, amplifiers, and receiver assemblies for magnetic resonance applications such as imaging and spectroscopy.

BACKGROUND

RF coils for magnetic resonance imaging, spectroscopy, and other magnetic resonance applications have typically been based on conventional resonant and predetermined impedance transformation designs ('tune and match', tank circuit types) such as described in, for example, Roemer et al., "The NMR Phased Array," Magn. Reson. Med. 16:192-225 (1990). However, the electronic decoupling of multiple coils of such tuned designs in a parallel acquisition array remains a significant engineering problem. In addition, such tuned coils (or sets of such coils) are generally unable to detect two different nuclides in one MR scanning session, and different coils may be needed due to the different Larmor frequencies associated with different static magnetic field strengths.

SUMMARY

Antenna assemblies comprise a conductive coil and an amplifier having an input coupled to the conductive coil. In a typical example, the amplifier has an input impedance greater than about 500 Ohms, 1000 Ohms, or 2000 Ohms. In a representative example, an input impedance is about 2.2 kOhms. In some examples, the amplifier comprises a first HEMT and a second HEMT, and first and second ends of the conductive coil are coupled to respective gates of the first HEMT and the second HEMT. In other examples, antenna assemblies include a substrate, wherein the conductive coil is defined on the substrate. In other embodiments, an inductor is situated to couple the first coil end and the second coil end. According to further examples, antenna assemblies include a circuit substrate, wherein the first HEMT and the second HEMT are defined on the circuit substrate. In some examples, the circuit substrate is gallium arsenide. In other examples, an op amp is coupled to the first HEMT and the second HEMT so as to produce an output signal based on a difference between input signals received from the first HEMT and the second HEMT. In additional representative examples, an inductor is coupled to first and second coil ends and tapped to ground.

Methods of detecting a magnetic resonance signal at a signal frequency include situating an antenna assembly that is substantially non-resonant at the signal frequency in proximity to a specimen, and processing an electrical signal from the antenna assembly to produce a detected magnetic resonance signal. In other examples, methods of detecting a magnetic resonance signal include situating a conductive loop near a region of interest, wherein the conductive loop has a length substantially smaller than a wavelength associated with the magnetic resonance signal. First and second ends of the conductive loop are coupled to respective field effect transistors (FETs), outputs from the first and second FETs are combined to produce a detected magnetic resonance signal. In additional examples, the conductive loop is defined on a rigid substrate. In some examples, the FETs are GaAs HEMTs. According to representative examples, a first inductor and a second inductor are coupled in series with the conductive loop, and a reference potential is established at a connection of the first inductor and the second inductor. In some examples, a single conductive loop has an effective diameter of less than about 15 cm, 7.5 cm, 5.0 cm, or 2.5 cm. In other representative examples, the conductive loop is defined in a conductive layer on the substrate.

BRIEF DESCRIPTION OF THE DRAWINGS

FIG. 5 is a schematic diagram of two coils directly coupled to respective FETs.

FIG. 6 is a schematic diagram of a center-tapped coil directly coupled to two FETs.

FIG. 7 is a schematic diagram of an array of coils.

DETAILED DESCRIPTION

Figure 1A:
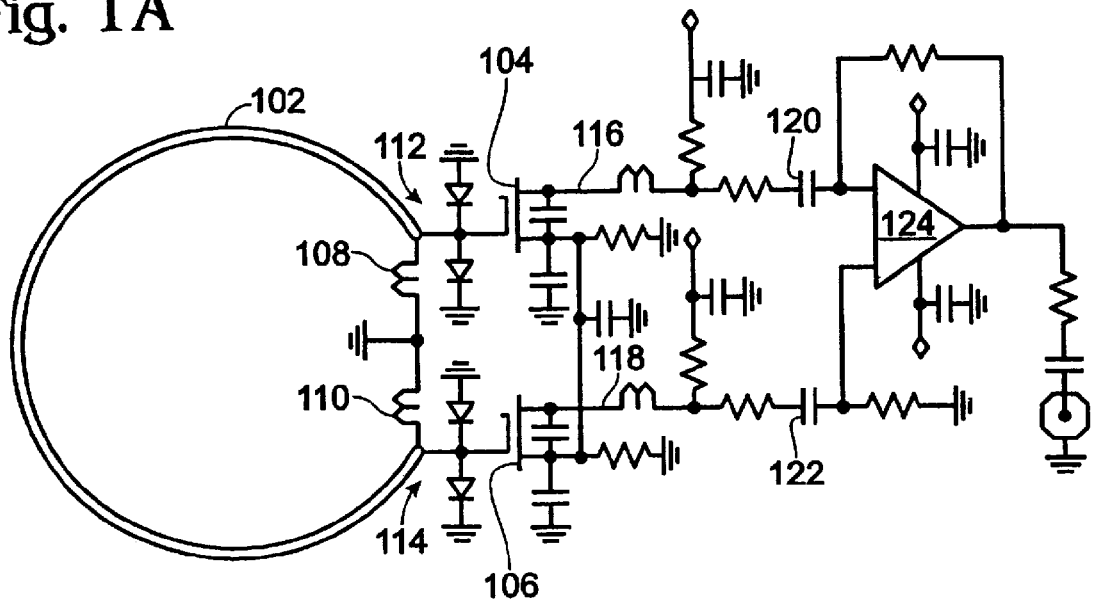
FIG. 1A is a schematic diagram of a single turn coil directly coupled to a high input impedance preamplifier. In the example of FIG. 1A, the coil has an effective diameter of about 7.5 cm and is defined on a rigid substrate as a conductive strip of width of about 2.5 mm.

As used in this application and in the claims, the singular forms "a," "an," and "the" include the plural forms unless the context clearly dictates otherwise. Additionally, the term "includes" means "comprises." Further, the term "coupled" means electrically or electromagnetically coupled or linked and does not exclude the presence of intermediate elements between the coupled items.

The described systems, apparatus, and methods described herein should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Described below are representative examples of so-called 'Hertzian' or non-resonant coils (NRCs) and preamplifiers having high input impedances, typically greater than at least about 500 Ohms, 1000 Ohms, or 2000 Ohms. Such coils and preamplifiers can be used in conventional MRI, parallel imaging, and multinuclear spectroscopic/imaging applications as well as other applications such as analytical NMR. In contrast to conventional tuned coils and coil systems, the disclosed coil/amplifier systems can be placed in close proximity with reduced coupling from one coil to another due to the high preamplifier impedances that limit or reduce coil currents. In addition, total coil or loop conductor length is less than about $\frac{1}{10}$ or $\frac{1}{4}$ of a wavelength associated with a signal of interest. Loop dimensions (length and cross-section) can be selected for arrangement as part of an array, or to define a sufficient cross-section to provide a predetermined antenna gain or directionality.

Isolation between multiple antennas/coils can be achieved by reducing antenna loop currents by, for example, coupling antenna loops to high input impedance devices such as FETs. For example, low noise high electron mobility transistors (HEMTs) in combination with a tuned (or untuned) antenna coil can allow imaging that is equivalent to systems based on standard tuned coils. A differential input can reduce or eliminate the sensitivity of the antenna to feedback caused by the close proximity of the amplifier output and the coil. In addition, the coil can be coupled to FETs and the FET outputs coupled to an op-amp to provide additional gain or to provide impedance matching to, for example, a 50 Ohm cable. Such a configuration is illustrated in FIG. 1A.

Referring to FIG. 1A, a loop antenna 102 is coupled to high electron mobility transistors (HEMTs) 104, 106. Inductors 108, 110 are situated to bias the gates of the HEMTs to ground for proper operation. In other examples, a reference bias other than ground can be selected. These inductors are large compared to the frequency of operation and they do not play any part in resonance of the antenna coil. The inputs of the HEMTs are protected by respective sets of back-to-back diodes 112, 114 in order to limit input voltages to less than about 1.0 V peak to peak. The HEMTs 104, 106 provide a differential high impedance input that is estimated to be about 2 kOhms at 123.3 MHz. In this example, the HEMTs 104, 106 are microwave devices capable of 5 GHz operation, and a small 0.5 pF capacitor and 10 nH inductor are used with the HEMTs to stabilize the circuit and prevent oscillations. The two bias resistors on each HEMT (150 Ohms and 10 Ohms) can be experimentally selected to bias the HEMTs based on amplifier stability and noise considerations, and in some examples are selected to reduce or minimize noise and increase or maximize stability.

The outputs 116, 118 from the HEMTs 104, 106 are then coupled to an op amp 124 via 0.01 µF DC block capacitors 120, 122. Output levels at the HEMTs 104, 106 are typically at about 2 V, and the DC block capacitors reject this DC level. An op amp output is series terminated with a 51 Ohm resistor for impedance matching to conventional 50 Ohm coaxial cable to reduce sensitivity to cable length. A series 0.01 µF capacitor is provided for compatibility with selected magnetic resonance imaging (MRI) electronics in which a power supply voltage of about 10 V is provided on the signal input cable. The amplified signal is coupled to an SMA or other connector for convenience in attaching to signal cables. The circuit operates from an external ±5 V power supply, but could be configured to operate from the 10 V supply voltage on the signal cable.

Several examples of the above circuit have been built and tested. Typically, two such coils can be overlaid with little interaction and only when two coils are directly overlapped with no spacing, a small signal reduction is observed. This is a significant improvement over conventional MRI antennas, and permits situating arrays of antennas almost arbitrarily without undesirable antenna coupling effects.

Figure 1B:
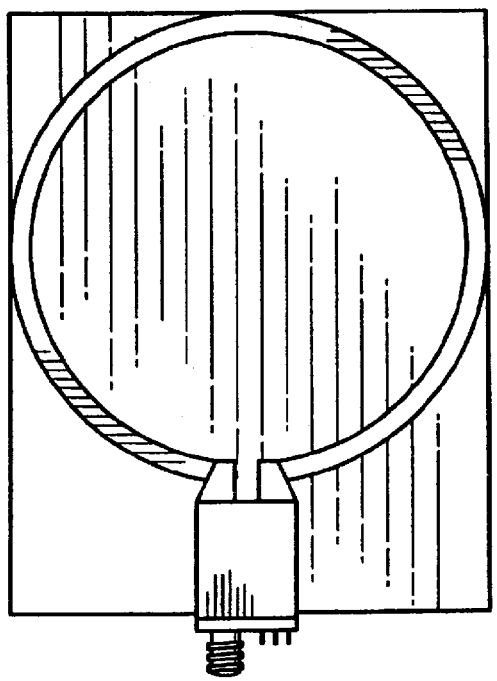
FIG. 1B is a photograph of a coil/preamplifier combination. The nominal operating parameters for the preamplifier are: noise figure=0.5 dB; gain=25 dB; apparent reactive input impedance≈2.2 k$\Omega$, and dynamic range≈90 dB.
Figure 2A:
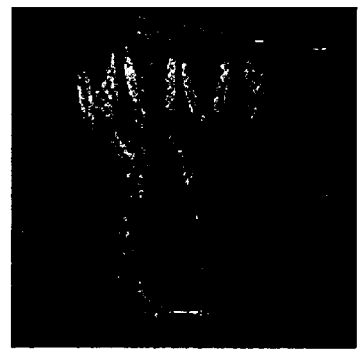
FIGS. 2A-2B contains MR human hand images obtained using a non-resonant coil (NRC) assembly. Acquisition parameters are: long axis slice orientation, dual echo sequence, TR=3000 ms, TE=15 ms; in-plane resolution=500×500 µm, slice 2 mm, 20 slices; number of acquisitions NA=4; total acquisition time=7 min.
Figure 2B:
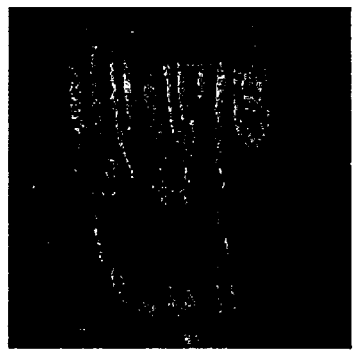
Figure 3:
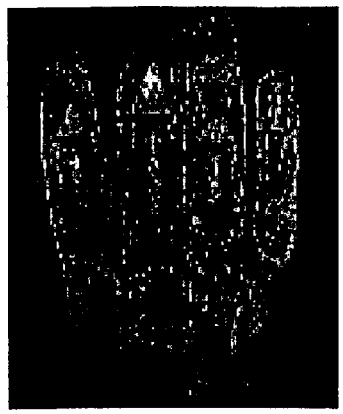
FIG. 3 is a MR human hand image using a 3-D volumetric interpolated breath-hold examination (VIBE) sequence. Acquisition parameters are TR=20 ms, TE=1.5 ms; in-plane resolution=1 mm×1 mm, slice=1 mm; NA=1, 40 slices in slab; total acquisition time=6.6 min.
Figure 4:
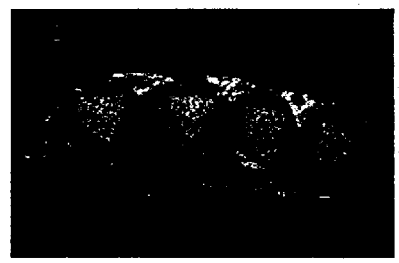
FIG. 4 is a human hand image. Acquisition parameters are: transverse axis of hand, T2-W sequence, TR=4000 ms, TE=82 ms, in-plane resolution=300×300 µm, slice=2.5 mm, 10 slices; NA=1; total acquisition time=5.6 min.
Figure 9B:
FIGS. 9A-9C are additional example magnetic resonance images of a human wrist obtained using a 2D Fast Low Angle Shot (FLASH) sequence. Acquisition parameters are TR=500 ms, TE=9.7 ms, flip angle=−25 degrees, slice thickness=2 mm, field of view=90 by 120 mm, matrix size=192 by 256, total acquisition time=6 min, with 2 averages.
Figure 9A:
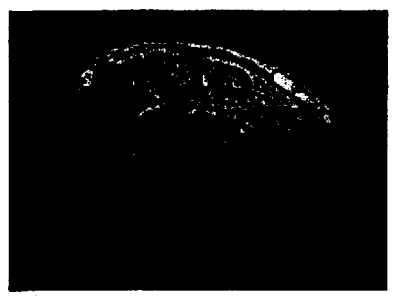
Figure 9C:

A representative example of a coil/preamplifier assembly is illustrated in FIG. 1B. In this example, the preamplifier occupies an area of about $\frac{5}{8}$" by $\frac{7}{8}$", and could be further reduced in size by using a different connector. The preamp does not require a shield, reducing metal content of the assembly and eddy currents produced in metal portions in MRI operation. The bandwidth of the assembly is from about 40 MHz to about 130 MHz, and within this bandwidth, the frequency response is approximately flat. This test amplifier contains only small portions of slightly ferromagnetic materials (such as nickel) and most components (HEMTs, op amp) are non-magnetic. However, additional or all components can be selected so that no ferromagnetic materials are included.

Human hand images obtained at 3 T using such a single coil/preamplifier assembly (a non-resonant or "NRC") are shown in FIGS. 2-5. A Helmholtz coil (resonant design, without PIN diode detuning) was used as a transmit coil and passive diode input protection was used on the receive coil but no active or passive detuning was used for the NRC. Note the vascular detail in FIGS. 2A-2B, the bone detail in FIG. 3, and the trabecular structures seen in FIG. 4. No band-limiting filter on the preamp output was used in the acquisition of these images.

Additional coil/preamplifier configurations are illustrated in FIGS. 5-6. As shown in FIG. 5, coils 502, 504 are coupled to respective FETs (such as GaAs FETs) 506, 508 that are in turn coupled to an op amp 510. The coils 502, 504 can have one, two, or more turns, and typically the number of turns is the same for both. With this configuration, the bias inductors 108, 110 shown in FIG. 1A can be eliminated. The op amp output is coupled to a coaxial cable 512.

Referring to FIG. 6, a coil 602 is center-tapped to ground, and coil ends are coupled to respective FETs and an op amp. The coil 602 can have various numbers of turns, but a single turn coil tends to reduce coupling in applications in which several coil assemblies are needed.

In examples of the coil/preamplifier systems, coil dimensions are typically selected to avoid electrical resonances that are at or near frequencies associated with signals to be received. Preamplifiers having relatively flat frequency responses can be used, so deformable or arbitrary shaped coil assemblies can be used. With conventional tuned coils, any deformation is generally associated with an unacceptable change in resonant frequency, so that a tuned coil assembly becomes detuned. As a result, detected signal magnitude decreases. In addition, because the NRC assemblies are relatively broadband, a single NRC assembly can be used to detect multiple nuclide resonances, or detect other signals associated within a broad spectral range. In addition, such an NRC can be used in MR systems having differing static magnetic fields. For example, a particular NRC system can be used at 1.5 T, 3.0 T or other magnetic field strengths. Coil portions of NRCs can be defined with lengths of wire or other conductors, or conductive traces on rigid or flexible substrates.

Using NRCs as described above, high resolution, high SNR images can be obtained. Transmit coil detuning is not required. Such NRCs are limited in bandwidth principally by the preamp circuit configurations and can work over a range of frequencies from at least 25 MHz to 125 MHz with no adjustments, permitting multinuclear magnetic resonance imaging/spectroscopy with a single receiver coil having no tuning or matching circuit elements. Such NRCs can be placed in virtually any configuration for phased array and other parallel imaging applications with no constraints necessary for decoupling from other coils. For example, an array of NRCs can be configured to provide substantially uniform detection sensitivity over an area defined by an array area. For example, as shown in FIG. 7, a coil array 700 can include a plurality of coils 702 arranged in rows and columns, or otherwise arranged. The coils 702 can be situated in close proximity and tend to exhibit reduced cross coupling and reduced non-uniformities such as those associated with resonant coils.

Figure 8:
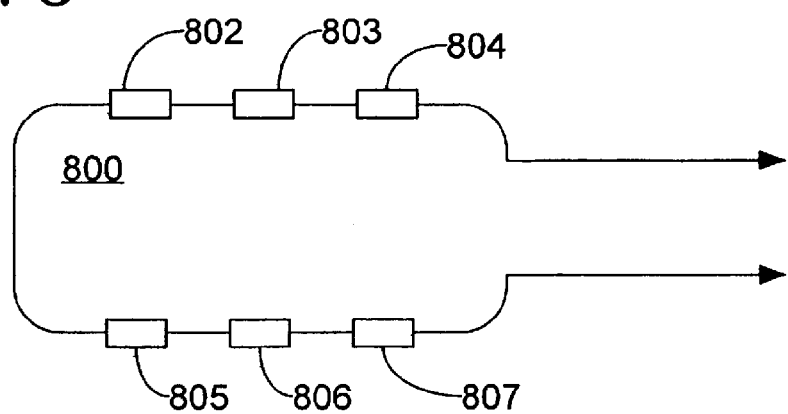
FIG. 8 is a schematic diagram of a coil that includes distributed resistance.

Non-resonant antennas can be implemented by coupling a single turn or multi-turn coil to a high input impedance detection system based on, for example, HEMTs. The high input impedance limits current flow in the coil, and thereby reduces the Q of any resonant circuit that includes the coil. In other examples, resonance can be avoided by provided a lumped element or distributed resistance in the coil. For example, FIG. 8 illustrates a single turn coil 800 that includes a plurality of resistors 802-807. Alternatively, a coil can be fabricated or configured to provide a selected resistance by, for example, defining the coil as a thin or narrow conductor layer on a substrate, or selecting a less conductive coil material.

In some examples, coils and/or preamplifiers can be configured to operate at reduced temperatures to improve signal to noise ratio (SNR) or other performance parameters. For example, coil/preamplifiers as described above can be cooled to temperatures of about 77 K using liquid nitrogen to reduce Johnson noise associated with the coil/preamplifier combination. Coil/preamplifier assemblies can be cooled in other ways as well.

Because the Larmor frequencies of specimen spins are proportional to static magnetic field strength, the disclosed coil assemblies can be used to assess, image, or otherwise investigate specimens at two or more static magnetic field strengths without altering the coil assembly or substituting coil assemblies. With resonant coils, different coils or coil tuning is required.

The embodiments described above are representative examples, and the disclosed technology is not limited to these examples. For example, antenna loops can be circular, rectangular, elliptical, triangular, or other regular or irregular shape. We claim all that is encompassed by the appended claims.

We claim:

1. A method of detecting a magnetic resonance signal at a predetermined signal frequency, comprising:
    situating in proximity to a specimen an antenna assembly comprising a non-resonant coil that is substantially non-resonant at the predetermined signal frequency;
    receiving with the non-resonant coil an electrical signal associated with the specimen;
    coupling from the non-resonant coil of the antenna assembly to a differential amplifier the received electrical signal at the predetermined signal frequency, wherein the predetermined signal frequency is within an amplifier bandwidth; and
    processing the received electrical signal to produce a detected magnetic resonance signal.

2. The method of claim 1 wherein the antenna assembly comprises a non-resonant coil having a total conductor length less than ¼ of a wavelength of the predetermined signal frequency.

3. The method of claim 2 wherein the non-resonant coil is coupled to a high impedance device.

4. The method of claim 1 wherein the amplifier has a high input impedance.

5. The method of claim 1 wherein the amplifier has a bandwidth of at least 25 MHz to 125 MHz.

* * * * *

UNITED STATES PATENT AND TRADEMARK OFFICE
CERTIFICATE OF CORRECTION

PATENT NO. : 7,683,619 B2  Page 1 of 1
APPLICATION NO. : 12/066244
DATED : March 23, 2010
INVENTOR(S) : Jolinda C. Smith It is certified that error appears in the above-identified patent and that said Letters Patent is hereby corrected as shown below:

The following text should be inserted at col. 1, line 12:

--Statement of Government Sponsored Support
This invention was made with Government support under contract DAMD17-01-1-0750 awarded by U.S. Army Medical Research and Materiel Command. The Government has certain rights in this invention.--

Signed and Sealed this

First Day of June, 2010

David J. Kappos
*Director of the United States Patent and Trademark Office*